(12) United States Patent
Aritome et al.

(10) Patent No.: US 8,891,309 B2
(45) Date of Patent: Nov. 18, 2014

(54) REDUCING READ FAILURE IN A MEMORY DEVICE

(75) Inventors: Seiichi Aritome, Boise, ID (US); Alessandro Torsi, Avezzano (IT); Carlo Musilli, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 350 days.

(21) Appl. No.: 13/272,336

(22) Filed: Oct. 13, 2011

(65) Prior Publication Data

US 2012/0051139 A1 Mar. 1, 2012

Related U.S. Application Data

(62) Division of application No. 12/706,357, filed on Feb. 16, 2010, now Pat. No. 8,059,474, which is a division of application No. 11/513,891, filed on Aug. 31, 2006, now Pat. No. 7,684,243.

(51) Int. Cl.
*G11C 11/34* (2006.01)
*G11C 16/04* (2006.01)
*G11C 16/34* (2006.01)

(52) U.S. Cl.
CPC ........ *G11C 16/3418* (2013.01); *G11C 16/3427* (2013.01)
USPC ............ 365/185.18; 365/185.02; 365/185.17; 365/185.22

(58) Field of Classification Search
USPC .............. 365/185.02, 185.17, 185.18, 185.22
See application file for complete search history.

(56) References Cited

U.S. PATENT DOCUMENTS

| | | | |
|---|---|---|---|
| 5,798,968 A | 8/1998 | Lee et al. | |
| 6,069,039 A | 5/2000 | Lee et al. | |
| 6,175,522 B1 | 1/2001 | Fang | |
| 6,771,536 B2 | 8/2004 | Li et al. | |
| 7,006,379 B2 * | 2/2006 | Noguchi et al. | 365/185.17 |
| 7,009,881 B2 | 3/2006 | Noguchi | |
| 7,035,143 B2 | 4/2006 | Lee | |
| 7,061,798 B2 | 6/2006 | Chen et al. | |
| 7,072,216 B2 | 7/2006 | Kim | |
| 7,099,200 B2 | 8/2006 | Sakui | |
| 7,170,785 B2 | 1/2007 | Yeh | |
| 7,272,043 B2 | 9/2007 | Liao et al. | |
| 7,292,476 B2 | 11/2007 | Goda et al. | |
| 7,511,995 B2 | 3/2009 | Oowada | |

* cited by examiner

*Primary Examiner* — Vanthu Nguyen
(74) *Attorney, Agent, or Firm* — Dicke, Billig & Czaja, PLLC

(57) ABSTRACT

Read failure is reduced by increasing the drain current through a serial string of memory cells during the read operation. In one embodiment, this is accomplished by using a higher read pass voltage for unselected word lines when the selected word line is within a predetermined distance of the drain side of the memory block array. If the selected word line is closer to the source side, a lower read pass voltage is used. In another embodiment, the cells on the word lines closer to the drain side of the memory block array are erased to a lower threshold voltage than the memory cells on the remaining word lines.

20 Claims, 9 Drawing Sheets

FIG. 4

| | WL0 CELL READ | WL1 CELL READ | ... | WL28 CELL READ | WL29 CELL READ | WL30 CELL READ | WL31 CELL READ |
|---|---|---|---|---|---|---|---|
| BL (SELECTED) | 1.0V | 1.0V | | 1.0V | 1.0V | 1.0V | 1.0V |
| BL (UNSELECTED) | 0V | 0V | | 0V | 0V | 0V | 0V |
| SG(D) | 3.5V | 3.5V | | 3.5V | 3.5V | 3.5V | 3.5V |
| WL31 | Vpass_read (L) | Vpass_read (L) | | Vpass_read (L) | Vpass_read (H) | Vpass_read (H) | 0V |
| WL30 | Vpass_read (L) | Vpass_read (L) | | Vpass_read (L) | Vpass_read (H) | 0V | Vpass_read (H) |
| WL29 | Vpass_read (L) | Vpass_read (L) | | Vpass_read (L) | 0V | Vpass_read (H) | Vpass_read (H) |
| WL28 | Vpass_read (L) | Vpass_read (L) | | 0V | Vpass_read (H) | Vpass_read (H) | Vpass_read (H) |
| ... | ... | ... | | ... | ... | ... | ... |
| WL2 | Vpass_read (L) | Vpass_read (L) | | Vpass_read (L) | Vpass_read (H) | Vpass_read (H) | Vpass_read (H) |
| WL1 | Vpass_read (L) | 0V | | Vpass_read (L) | Vpass_read (H) | Vpass_read (H) | Vpass_read (H) |
| WL0 | 0V | Vpass_read (L) | | Vpass_read (L) | Vpass_read (H) | Vpass_read (H) | Vpass_read (H) |
| SG(S) | 3.5V | 3.5V | | 3.5V | 3.5V | 3.5V | 3.5V |
| SOURCE | 0V | 0V | | 0V | 0V | 0V | 0V |
| P-WELL | 0V | 0V | | 0V | 0V | 0V | 0V |

…

REDUCING READ FAILURE IN A MEMORY DEVICE

RELATED APPLICATIONS

This is a divisional of U.S. application Ser. No. 12/706,357, titled "REDUCING READ FAILURE IN A MEMORY DEVICE," filed Feb. 16, 2010, now U.S. Pat. No. 8,059,474, which is a divisional of U.S. application Ser. No. 11/513,891, titled "REDUCING READ FAILURE IN A MEMORY DEVICE," filed Aug. 31, 2006, now U.S. Pat. No. 7,684,243, all of which are commonly assigned and incorporated herein by reference.

TECHNICAL FIELD

Embodiments of the present invention relates generally to memory devices and in particular to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. All memory can be considered either volatile or non-volatile.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures. These architectures are named for the resemblance that the basic memory cell configuration of each architecture has to a basic NAND or NOR gate circuits, respectively.

In the NOR array architecture, the floating gate memory cells of the memory array are arranged in a matrix. The gates of each floating gate memory cell of the array matrix are connected by rows to word select lines (word lines) and their drains are connected to column bitlines. The source of each floating gate memory cell is typically connected to a common source line. The NOR architecture floating gate memory array is accessed by a row decoder activating a row of floating gate memory cells by selecting the wordline connected to their gates. The row of selected memory cells then place their stored data values on the column bitlines by flowing a differing current if in a programmed state or not programmed state from the connected source line to the connected column bitlines.

FIG. 1 illustrates a simplified diagram of a typical prior art NAND flash memory array. The memory array of FIG. 1, for purposes of clarity, does not show all of the elements typically required in a memory array. For example, only two-bit lines are shown (BL1 and BL2) when the number of bit lines required actually depends upon the memory density.

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bit lines BL1, BL2 are eventually coupled to sense amplifiers (not shown) that detect the state of each cell.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1, BL2) by a drain select gate 112, 113. The source select gates 116, 117 are controlled by a source select gate control line SG(S) 118 coupled to their control gates. The drain select gates 112, 113 are controlled by a drain select gate control line SG(D) 114.

During a read operation, the unselected word lines of a selected memory block are biased at $V_{pass\_read}$ that is typically approximately 5V. This enables the unselected memory cells to act as pass gates for the memory cells on the selected word line.

FIG. 2 illustrates a plot of control gate voltage ($V_{cg}$) versus drain current ($I_d$) during a read operation. During a read of the memory cells on WL0 208, there are no source side pass gates. The select gate source transistor is adjacent to the memory cells of WL0. Therefore, the memory string resistance between the selected memory cell and ground is minimal and the sub-threshold slope 208 is very steep. However, a drain-side cell read operation (e.g., WL31) has a greater quantity of memory cells between the selected cell and ground and, therefore, a larger string resistance during, a read operation. This provides a gentler sub-threshold slope 210 and an increased probability of read failure due to decreased cell current caused by the increased resistance. The plot for the middle word line (i.e., WL16) shows a slope 209 between the other slopes 208 and 210.

FIG. 2 also shows the drain current pass/fail trip point 200. This is the $I_d$ at which a memory read operation either passes or fails, depending on $I_d$. The read voltage, $V_{cg}$ 203, is shown as the vertical dotted line.

For the reasons stated above, and for other reasons stated below which will become apparent to those skilled in the art upon reading and understanding the present specification, there is a need in the art for a way to address read failure in a memory device.

BRIEF DESCRIPTION OF THE DRAWINGS

FIG. 4 shows a table of $V_{read}$ and $V_{pass\_read}$ voltages in accordance with the read operation of FIG. 3.

DETAILED DESCRIPTION

Figure 1:
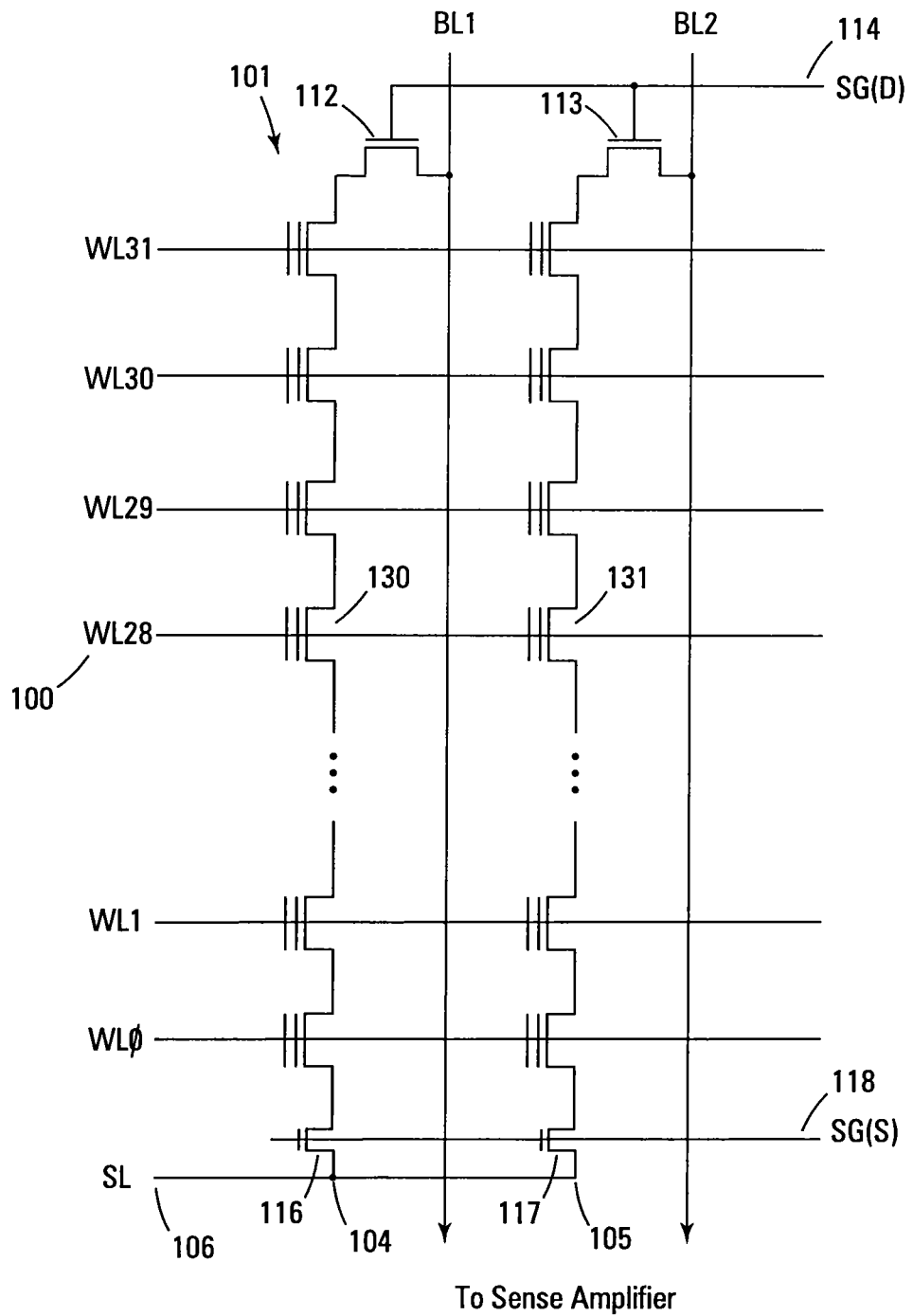
FIG. 1 shows a typical prior art NAND architecture memory array with word line biasing.
Figure 2:
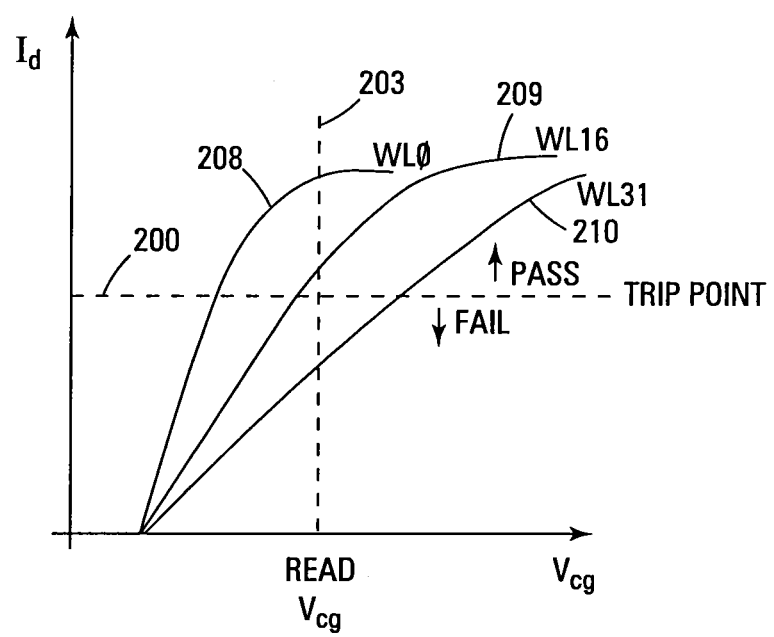
FIG. 2 shows a typical prior art plot of control gate voltage versus drain current in a typical, non-volatile memory device.

In the following detailed description, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
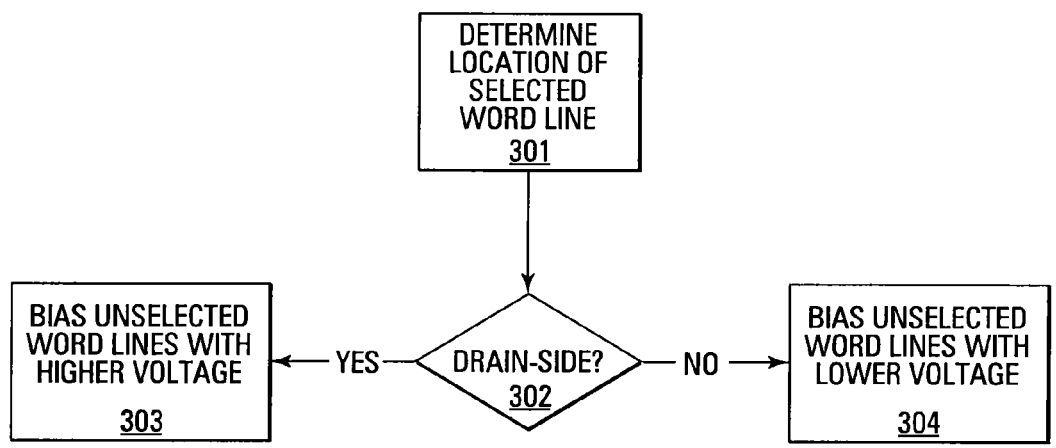
FIG. 3 shows a flowchart of one embodiment of a read operation of the present invention.
Figure 9:
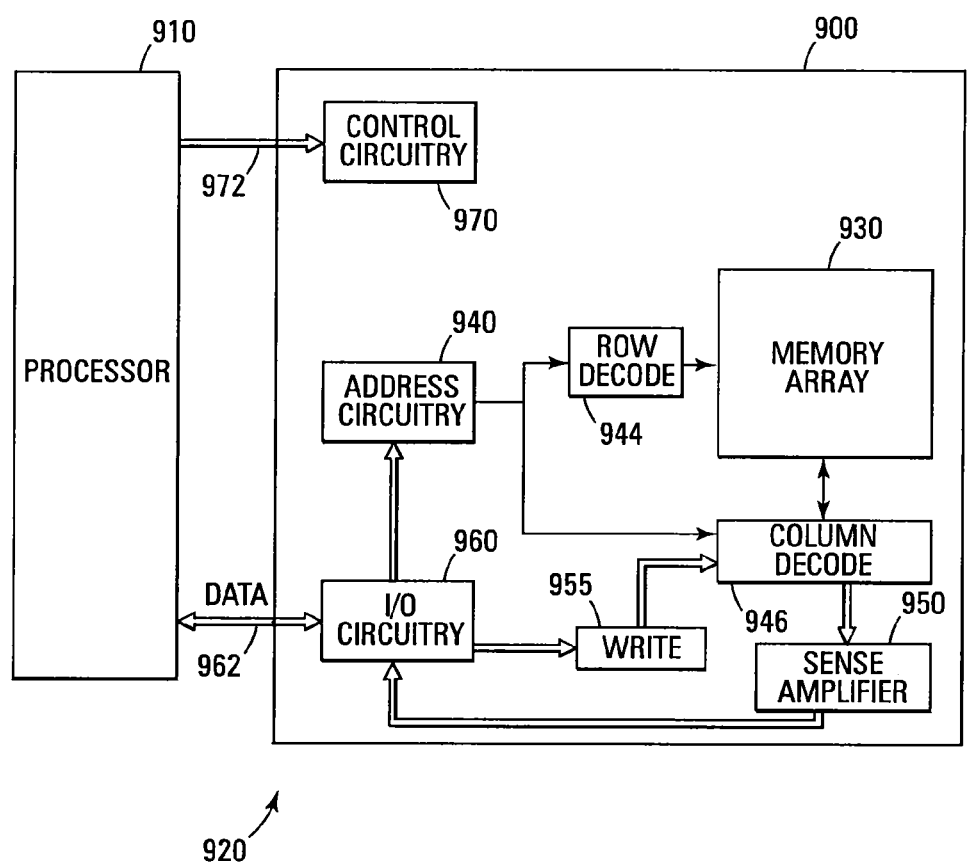
FIG. 9 shows a block diagram for one embodiment of a memory system of the present invention.

FIG. 3 illustrates a flowchart of one embodiment of a read method of the present invention. A read command is received by the memory device to initiate the read operation. The read command can be generated by a processor or other control circuitry as illustrated in FIG. 9. The read command contains a logical address of the desired memory cell or cells to be read. The memory device controller translates this address into a physical address of the selected memory cell(s).

The physical address determines the location of the selected word line that contains the memory cell or cells that are desired to be read 301. The selected word line number determines whether the word line is a drain-side word line or a source-side word line 302. As shown in the memory array of FIG. 1, the drain-side word lines are closest to the top of the array nearest select gate drain transistor 112, 113 that connects the series strings to the bit line BL1, BL2. The bit line is also referred to as the drain line.

The word lines that are considered to be drain-side word lines can vary with different embodiments of the present invention. For example, one embodiment can assign only WL31 as being a drain-side word line. Another embodiment can assign word lines WL29-WL31 as drain-side word lines. In still another embodiment, the upper half of the memory array (i.e., WL16-WL31) is considered to be drain-side word lines.

The location of the selected word line determines the biasing of the unselected word lines. If the selected word line is a drain-side word line, the unselected word lines are biased with a higher $V_{pass\_read}$ voltage (e.g., 5.5V) 303. If the selected word line is not a drain-side word line, the unselected word lines are biased with a lower $V_{pass\_read}$ voltage (e.g., 4.5V) 304. The selected word line, whether drain-side or source-side, is biased at a $V_{read}$ of 0V.

The above voltages are for purposes of illustration only Alternate embodiments can use other voltages for $V_{pass\_read}$, $V_{read}$, or other bias voltages.

FIG. 4 illustrates a table of voltages used during one embodiment of a read operation of the present invention. The embodiment illustrated in FIG. 4 considers WL29-WL31 to be drain-side word lines. As discussed previously, alternate embodiments use different drain-side word lines.

The illustrated read operation voltages are for biasing the bit lines (BL), select gate drain (SG(D)), WL0-31, select gate source (SG(S)), the source line, and the p-well. The unselected word line biasing is illustrated as either $V_{pass\_read}(L)$ for the lower $V_{pass\_read}$ voltage and $V_{pass\_read}(H)$ for the higher $V_{pass\_read}$ voltage. The voltages illustrated in this table are for purposes of illustration only as the present invention is not limited to any of these voltages.

The vertical columns of the table under each of the WL0 CELL READ-WL31 CELL READ headings are the bias voltages for the series string of memory cells when that particular word line is selected for reading. This is indicated by the biasing of the selected word line with a $V_{read}$ voltage of 0V.

While only two $V_{pass\_read}$ voltages are shown and described, the present embodiments are not limited to these two voltages (i.e., $V_{pass\_read}(L)$ and $V_{pass\_read}(H)$). For example, in one embodiment, three $V_{pass\_read}$ voltages can be used (i.e., $V_{pass\_read}(L)$, $V_{pass\_read}(H)$, and $V_{pass\_read}(M)$). In such an embodiment, the $V_{pass\_read}(M)$ pass voltage is used when a selected word line is in the middle third of the word lines (i.e., approximately WL10-WL20), $V_{pass\_read}(L)$ is used when the selected word line is in approximately the lower third of word lines (i.e., approximately WL0-WL9), and $V_{pass\_read}(H)$ is used when the selected word line is in approximately the upper third of word lines (i.e., WL21-WL31).

In another embodiment, the $V_{pass\_read}$ voltage can be graded in decreasing or increasing voltages depending on which word line is selected. For example, if WL31 is selected $V_{pass\_read}=6.0V$, if WL30 is selected, $V_{pass\_read}=5.8V$, if WL29 is selected, $V_{pass\_read}=5.6V$, if WL28 is selected, $V_{pass\_read}=5.4V$, etc. In yet another embodiment, $V_{pass\_read}$ can be in increasing levels from WL31 being selected such that $V_{pass\_read}=4.0V$ if WL31 is selected, $V_{pass\_read}=4.2V$ if WL30 is selected, etc. These voltages are for purposes of illustration only and do not limit any embodiments to any particular voltages or voltage increments.

While the above-described embodiments are discussed as being thr a read operation, an alternate embodiment can use the same voltages for a verify read operation as well.

Figure 5:
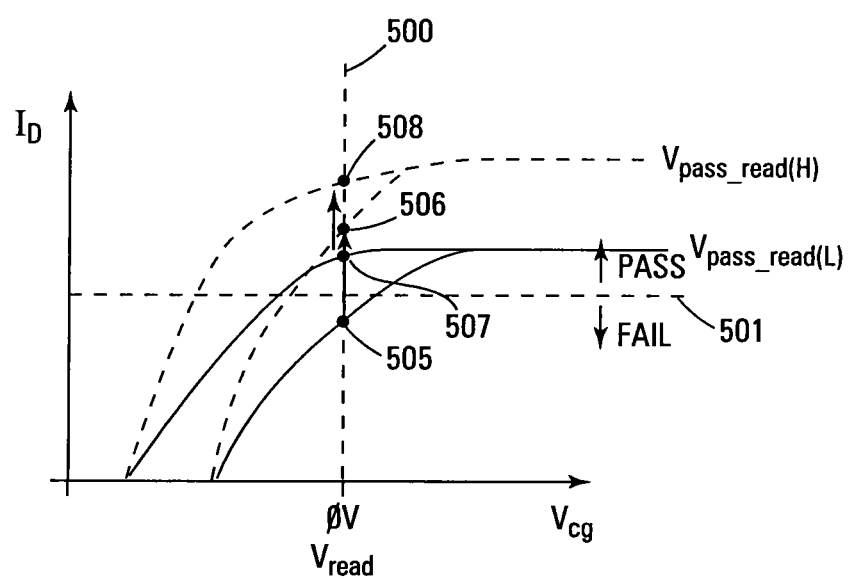
FIG. 5 shows a plot of control gate voltage versus drain current in accordance with the read operation of FIGS. 3 and 4.

FIG. 5 illustrates a plot of control gate voltage versus drain current in accordance with the read operation described above in FIGS. 3 and 4. This plot illustrates the 0V $V_{read}$ voltage as a vertical line 500 and the trip point 501 as a horizontal line. The trip point is the drain current level ($I_d$) at which any current above this point, the read cell passes the read operation and any current below this point, the read cell fails the read operation.

The plotted signals are drain currents that result from read operations on a predetermined word line. The solid lines are the result of drain currents from typical prior art read operations and the dotted lines are the result from the read operation of the present invention. These plots show that one read operation would fail 505 due to the drain current being below the pass/fail trip point 501. However, the read operation in which the unselected word lines are biased with the $V_{pass\_read}(H)$ voltage increases the drain current point 506 to the point that it passes.

The other prior art read operation drain current point 507 passes but is just above the pass/fail trip point. This read operation could still be susceptible to noise and other conditions that could make it fall below the trip point 501. With the higher $V_{pass\_read}(H)$ voltage, that point moves to the new location 508 such that it clearly passes the read operation. Therefore, the embodiments of the present invention clearly improve the read margin in a memory device. In other words, the read failure rate can be reduced.

Figure 6:
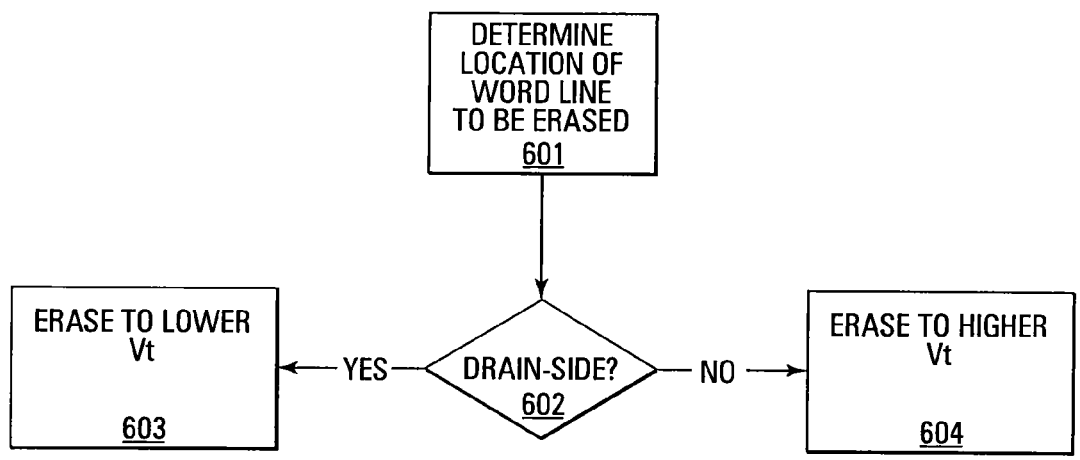
FIG. 6 shows a flowchart of an alternate embodiment of the read operation of the present invention.

FIG. 6 illustrates a flowchart of another embodiment of the present invention for reducing read failure due to decreasing cell current. This embodiment improves the read margin and minimizes read failure as in the embodiment of FIG. 3. However, the embodiment of FIG. 6 accomplishes this by erasing cells on the drain-side word lines to a deeper level (i.e., a more negative threshold voltage $V_t$). As in the previous embodiment, a drain-side word line can be considered to be WL31, WL29-31, WL16-31, or other upper word lines.

The embodiment of FIG. 6 starts when an erase command is received by the memory device to initiate a memory block erase operation. The erase command can be generated by a processor or other control circuitry that is coupled to the memory device of the present invention, as illustrated in FIG. 9. The memory device controller receives the erase command and determines from the command which physical addresses require erasing.

The physical addresses determine the location (i.e., drain-side or source-side) of each word line 601 as erase pulses are generated. The word line number determines whether the word line is a drain-side word line or a source-side word line 602 as discussed previously. As shown in the memory array of FIG. 1, the drain-side word lines are closest to the top of the array nearest select gate drain transistor 112, 113 that connects the series strings to the bit line BL1, BL2.

If a drain-side word line is being erased, it is erased to a lower $V_t$ 603 than if a source-side word line is being erased 604. One such embodiment of threshold voltages is illustrated in FIG. 7.

Figure 7:
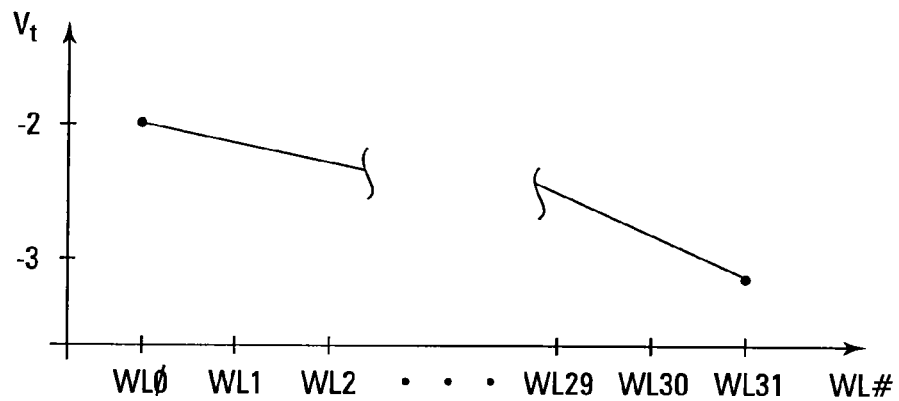
FIG. 7 shows a graded plot of word line number versus threshold voltage ($V_t$) in accordance with the alternate embodiment of FIG. 6.

FIG. 7 illustrates a plot of threshold voltage $V_t$ versus word line number. This plot shows one embodiment for the different threshold voltages for each word line of the memory block to be erased. In this embodiment, the $V_t$'s are graded such that WL0, a source-side word line, has the highest erased $V_t$ at −2V. WL31, a drain-side word line, has the lowest $V_t$ at −3V. Word lines WL1-WL30 have $V_t$'s that are ramped down between these two voltages. The voltages illustrated in this plot are for purposes of illustration only as the present invention is not limited to any of these voltages.

In one embodiment, the deeper erase condition can be accomplished by not performing a soft-programming operation on the drain side word lines prior to generating the erase voltages. In another embodiment, the deeper erase can be accomplished by applying a different predetermined voltage on the drain side word lines during the erase operation than that used on a source-side word line.

Figure 8:
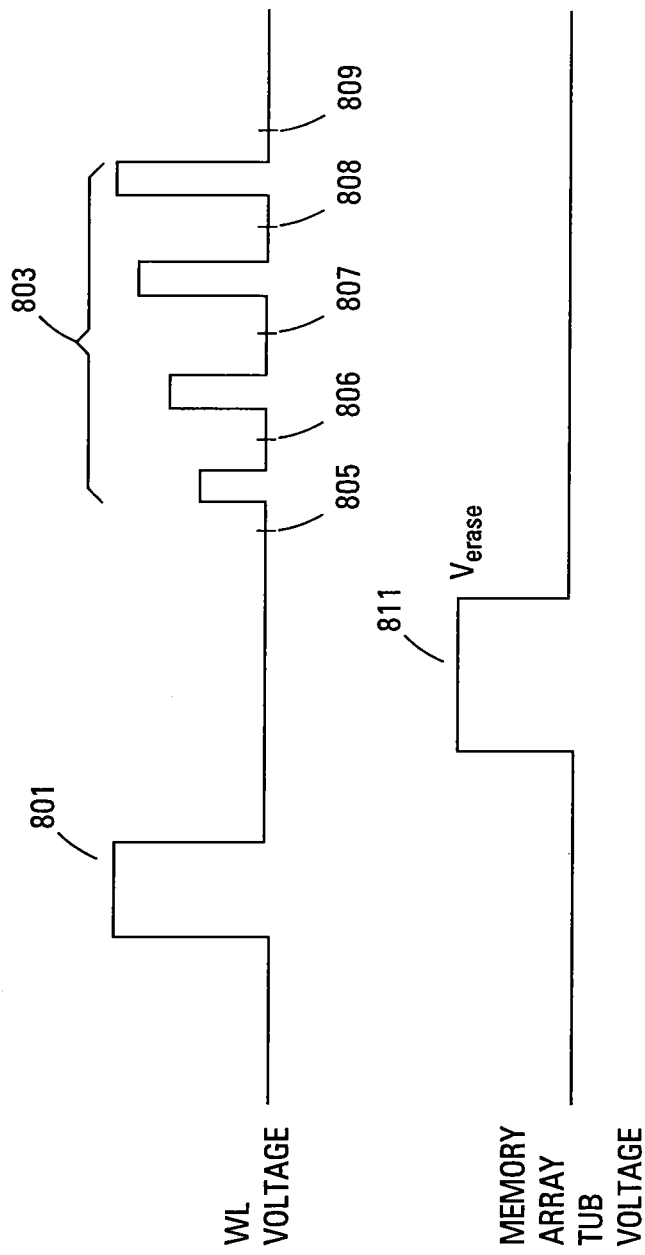
FIG. 8 shows the word line voltages and array tub voltages of a typical prior art erase operation.

FIG. 8 illustrates typical voltages for a typical erase operation that is well known to one skilled in the art. The word lines are initially biased with a pre-programming pulse 801 that ensures that all of the cells to be erased are programmed, thus reducing the possibility of over-erasure.

The memory array tub is then biased with an erase voltage pulse 811. This voltage, $V_{erase}$, can typically be around 18V.

A series of soft programming pulses 803 are then generated to bias the word lines. Between each soft programming pulse a verify operation 805-809 is performed to determine whether the soft programming pulse is necessary. Whether the soft programming pulses 805-809 are necessary and the quantity of soft programming pulses 805-809 required is determined by each verify operation since, once the cells to be erased are all programmed to the proper threshold voltage level, the soft programming pulses are not required.

One of the embodiments of the method of the present invention does not perform these soft programming pulses on the drain-side word lines. Since the soft programming pulses raise the threshold voltage of the erased cells, skipping the soft programming pulses provides a deeper erased state than that used in the prior art. The cells with the lower threshold voltage provide a larger drain current as pass, gates when biased with an unselect voltage during a read operation of the present invention.

The deeper erase can also be accomplished by applying a different predetermined voltage on the drain side word lines during the erase operation than that used on a source-side word line. For example, during the erase operation, a low voltage (e.g., 1V) is applied to the source-side word lines and 0V is applied the drain side word lines. This would provide the cells on the drain side word lines with a deeper erased condition than the remaining word lines.

In one embodiment, WL31 can be considered to be the only drain-side word line and WL0-30 would be the remaining word lines that can be considered to be the source-side word lines. During an erase operation in such an embodiment, WL31 would be biased at ground potential (i.e., 0V) while WL0-30 are biased at 1V. The erase pulse of the array tub would then cause WL31 to have a lower $V_t$ and WL0-30 to have a higher $V_t$. As in previous embodiments, these voltages and the word lines considered to be drain-side and source-side can vary with different embodiments.

FIG. 9 illustrates a functional block diagram of a memory device 900 that can incorporate embodiments for reading and erasing the non-volatile memory cells described herein. The memory device 900 is coupled to a controller 910. The controller 910 may be a microprocessor or some other type of controlling circuitry. The memory device 900 and the controller 910 form part of a memory system 920. The memory device 900 has been simplified to focus on features of the memory that are helpful in understanding the present invention. The memory and controller can be discreet devices, separate integrated circuits, a common device or a common integrated circuit. In one embodiment, the memory and controller are separate integrated circuit die packaged together in one chip set.

The memory device includes an array of memory cells 930 that, in one embodiment, are non-volatile memory cells such as flash memory cells. The memory array 930 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 940 is provided to latch address signals provided over I/O connections 962 through the I/O circuitry 960. Address signals are received and decoded by row decoders 944 and column decoders 946 to access the memory array 930. It will be appreciated by those skilled in the art that, with the benefit of the present description, the number of address input connections and row/column decoders depends on the density and architecture of the memory array 930. That is, the number of addresses increases with both increased memory cell counts and increased bank and block counts.

The memory integrated circuit 900 reads data in the memory array 930 by sensing voltage or current changes in the memory array columns using sense/buffer circuitry 950. The sense/buffer circuitry, in one embodiment, is coupled to read and latch a row of data from the memory array 930. Data input and output buffer circuitry 960 is included for bi-directional data communication over the I/O connections 962 with the processor 910. Write circuitry 955 is provided to write data to the memory array.

Control circuitry 970 decodes signals provided on control connections 972 from the processor 910. These signals are used to control the operations on the memory array 930, including data read, data write, and erase operations. The control circuitry 970 may be a state machine, a sequencer, or some other type of controller. The control circuitry 970 of the present invention, in one embodiment, is responsible for executing the embodiments of the reading and erasing methods of the present invention.

The flash memory device illustrated in FIG. 9 has been simplified to facilitate a basic understanding of the features of the memory and is for purposes of illustration only A more detailed understanding of internal circuitry and functions of flash memories are known to those skilled in the art. Alternate embodiments may include the flash memory cell of the present invention in other types of electronic systems.

Figure 10:
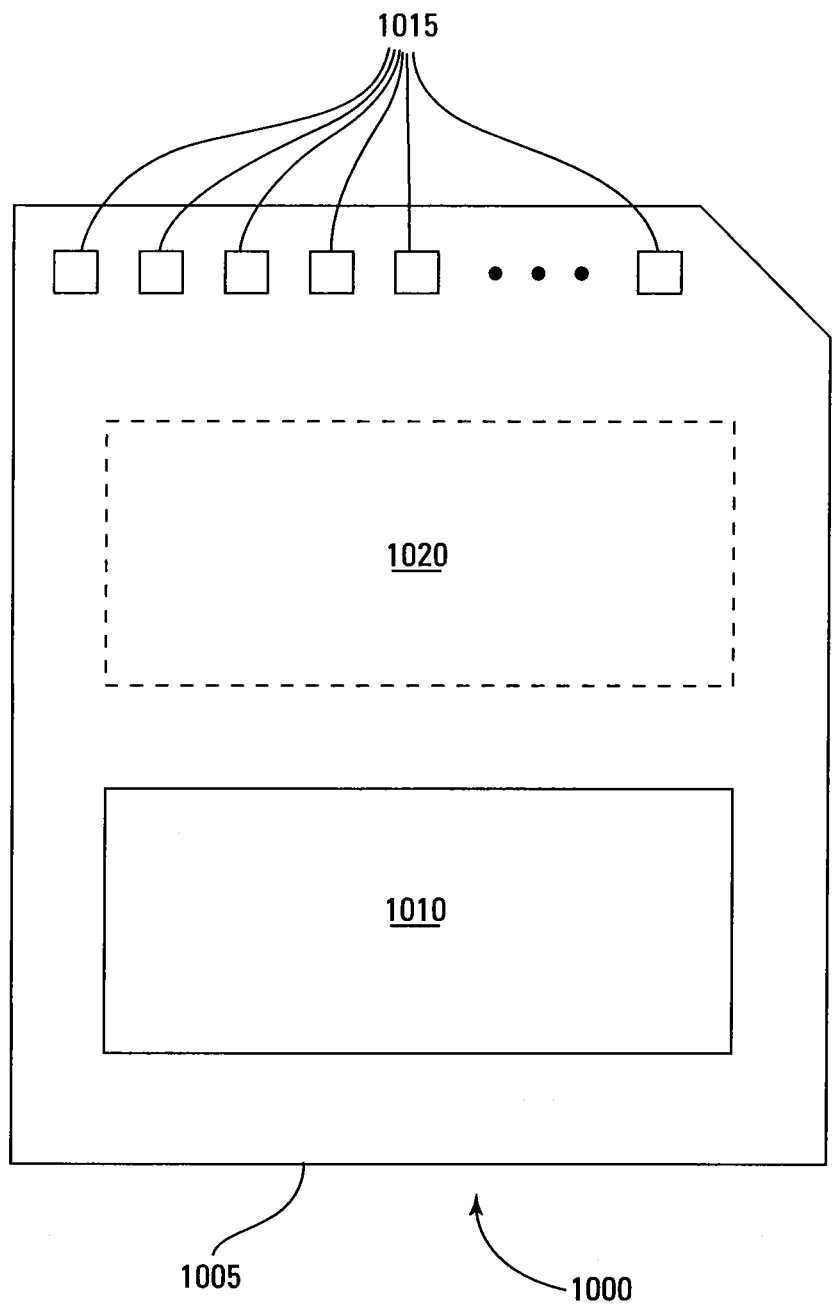
FIG. 10 shows a block diagram for one embodiment of a memory module of the present invention.

FIG. 10 is an illustration of a memory module 1000 that incorporates the memory cell embodiments as discussed previously. Although memory module 1000 is illustrated as a memory card, the concepts discussed with reference to memory module 1000 are applicable to other types of removable or portable memory, e.g., USB flash drives. In addition, although one example form factor is depicted in FIG. 10, these concepts are applicable to other form factors as well.

Memory module 1000 includes a housing 1005 to enclose one or more memory devices 1010 of the present invention. The housing 1005 includes one or more contacts 1015 for communication with a host device. Examples of host devices include digital cameras, digital recording and playback devices, PDAs, personal computers, memory card readers, interface hubs and the like. For some embodiment, the contacts 1015 are in the form of a standardized interface. For example, with a USB flash drive, the contacts 1015 might be in the form of a USB Type-A male connector. In general, however, contacts 1015 provide an interface for passing control, address and/or data signals between the memory module 1000 and a host having compatible receptors for the contacts 1015.

The memory module 1000 may optionally include additional circuitry 1020. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of I/O connections to the one or more memory, devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010. The additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

In summary, the embodiments of the present invention provide reduced read failure due to decreasing cell current. This is accomplished by increasing, from a normal prior art condition, the pass gate cell current during a read operation. In one embodiment, using a higher $V_{pass\_read}$ voltage on unselected word lines when the selected memory cell is a drain-side memory cell can increase the pass gate cell current. In another embodiment, the pass gate cell current can be increased by a deeper erased condition for cells that are closer to the drain-side of the memory block.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reducing read failure in a memory device having a memory array with a drain side and a source side, the method comprising:
   determining if a selected word line is closer to the drain side or the source side; and
   biasing unselected word lines with a first voltage if the selected word line is closer to the drain side, with a second voltage if the selected word line is closer to the source side, and with a third voltage if the selected word line is closer to a middle of the array between the source side and the drain side;
   wherein biasing unselected word lines with the third voltage comprises biasing an unselected word line on a drain side of the selected word line and an unselected word line on a source side of the selected word line with the third voltage;
   wherein the first voltage is greater than the second voltage; and
   wherein the drain side is at a higher potential than the source side.

2. The method of claim 1 wherein determining if the selected word line is closer to the drain side or the source side comprises translating a logical address of a selected memory cell that is coupled to the selected word line.

3. The method of claim 2 and further comprising translating the logical address into a physical address of the selected memory cell.

4. The method of claim 1 wherein the selected word line is closer to the drain side when it is immediately adjacent to the drain side.

5. The method of claim 1 wherein the selected word line is closer to the drain side when it is within a range of word lines closest to the drain side.

6. The method of claim 1 wherein the selected word line is closer to the drain side when it is within an upper half of the memory array.

7. The method of claim 1 wherein the selected word line is biased at a read voltage regardless of whether it is closer to the drain side or closer to the source side.

8. A method for reducing read failure in a memory device having a memory array with a drain side and a source side, the method comprising:
- determining a location of a selected word line between the drain side and the source side; and
- biasing unselected word lines with a pass read voltage that is different for different locations of the selected word line;
- wherein an unselected word line on a drain side of the selected word line and an unselected word line on a source side of the selected word line are biased with the same pass read voltage;
- wherein biasing the unselected word lines with the pass read voltage comprises biasing the unselected word lines with a first pass read voltage when the selected word line is closer to the drain side than the source side and biasing the unselected word lines with a second pass read voltage that is less than the first pass voltage when the selected word line is closer to the source side than the drain side; and
- wherein the drain side is at a higher potential than the source side.

9. The method of claim 8 wherein the pass read voltage decreases by a predetermined step voltage from an initial voltage when the selected word line is substantially adjacent to the drain side.

10. The method of claim 8 wherein the pass read voltage decreases by a predetermined step voltage from an initial voltage when the selected word line is substantially adjacent to the source side.

11. The method of claim 8 wherein biasing unselected word lines with the pass read voltage comprises biasing control gates of memory cells with the read pass voltage.

12. The method of claim 8 wherein determining the location of the selected word line comprises determining the physical address of a selected memory cell coupled to the selected word line.

13. The method of claim 8 wherein determining the location of the selected word line comprises determining a word line number of the selected word line.

14. The method of claim 8 wherein the pass read voltage is graded in decreasing or increasing voltages depending on the location of the selected word line.

15. The method of claim 8 wherein the determining of the location of the selected word line and the biasing of the unselected word lines is performed during a verify read operation.

16. The method of claim 8 wherein the memory array comprises one of a NAND architecture, a NOR architecture, or an AND architecture.

17. The method of claim 8 wherein the selected word line is biased at a read voltage of 0V.

18. The method of claim 8 wherein biasing unselected word lines with the pass read voltage comprises biasing unselected word lines with a plurality of different pass read voltages.

19. The method of claim 8 further comprising determining that the selected word line is closest to a select gate the drain side transistor and biasing the unselected word lines with the first pass read voltage.

20. The method of claim 8 further comprising determining that the selected word line is closest to the source side and biasing the unselected word lines with the second pass read voltage.

* * * * *

UNITED STATES PATENT AND TRADEMARK OFFICE
CERTIFICATE OF CORRECTION

| | | |
|---|---|---|
| PATENT NO. | : 8,891,309 B2 | Page 1 of 1 |
| APPLICATION NO. | : 13/272336 | |
| DATED | : November 18, 2014 | |
| INVENTOR(S) | : Seiichi Aritome et al. | |

It is certified that error appears in the above-identified patent and that said Letters Patent is hereby corrected as shown below:

In the Claims

Column 10, lines 25-26, in Claim 19, delete "closest to a select gate the drain side transistor" and insert -- closest to the drain side --, therefor.

Signed and Sealed this
Third Day of March, 2015

Michelle K. Lee
*Deputy Director of the United States Patent and Trademark Office*